Oct. 26, 1965 W. M. HENNESSEY 3,214,508

ELECTRONIC PACKAGE WITH DEFORMABLE LEAD SECURING MEANS

Filed April 23, 1963

INVENTOR.
WILLIAM M. HENNESSEY
BY Robert A. Green
ATTORNEY 3,214,508
United States Patent Office
Patented Oct. 26, 1965

3,214,508

ELECTRONIC PACKAGE WITH DEFORMABLE LEAD SECURING MEANS

William M. Hennessey, Roslyn, Pa., assignor to Burroughs Corporation, Detroit, Mich., a corporation of Michigan
Filed Apr. 23, 1963, Ser. No. 275,073
5 Claims. (Cl. 174—52)

Figure 1:
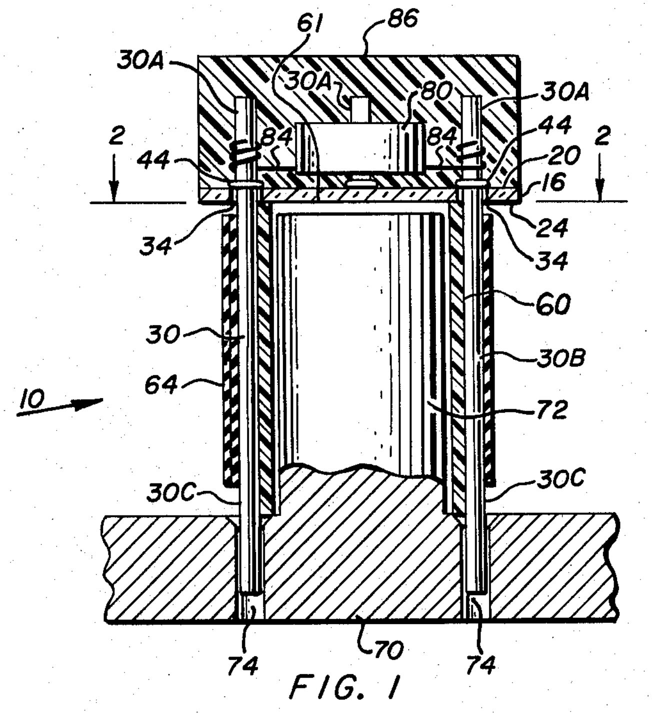

This invention relates to electronic packages and, particularly, to packages for electronic devices which include long, flexible leads supported in an insulating body.

One type of device to which the principles of the invention apply is a magnetic core transformer. Such a device comprises a core or cylinder of magnetic material which carries a plurality of windings, the ends of which are connected to separate leads. Generally, these leads are made of fine wire and are relatively long and easily deformable. These leads are mounted in a wafer or cup of insulating material. Generally, the leads are so secured by being set in place as the cup or wafer is molded, or they are soldered to eyelets which are molded in the cup or wafer. This type of arrangement for mounting the leads is undesirably expensive.

In addition, it has been found that devices such as core transformers, which include a plurality of long, flexible leads, are relatively difficult to handle and are particularly difficult to test since the insertion of all of the flexible leads into a test socket is time consuming and laborious.

The objects of the invention are directed toward the provision of an improved package for an electronic device which includes a plurality of deformable leads.

The package of the invention includes an insulating wafer or base which carries a plurality of elongated flexible leads, each having a shoulder which bears against the top surface of the wafer. The leads extend both above and below the wafer, with a considerable length of the leads extending below the wafer. A tubular insulating body is positioned between the leads below the wafer and bearing against the lower surface of the wafer, and means are provided securing the leads and the tubular body together to maintain this desired spatial relationship. The tubular body thus serves as a support for holding the leads in place in the wafer by maintaining the pressure of the shoulders of the leads against the top surface of the wafer.

In addition, the leads, which are normally not rigid and are easily deformed, are now held rigidly in place surrounding and in contact with the insulating tube. The leads may now be repeatedly and easily inserted in a socket for test purposes or the like, and the assembly as a whole may be handled with ease. The apparatus thus described comprises a support for an electronic device which is mounted on the wafer and is secured to selected ones of the leads which extend above the wafer. The package is completed by providing a body of insulating material surrounding the device and leads to which the device is secured.

Figure 2:
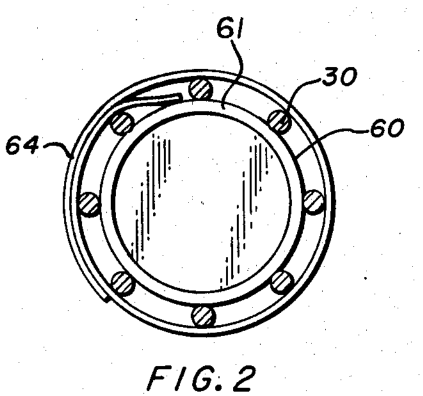

In the drawing:

FIG. 1 is an elevational view, partly in section, of a device embodying the invention; and FIG. 2 is a sectional view along the line 2—2 in FIG. 1.

The principles of the invention are described below as they relate to a magnetic pulse transformer. However, it will be clear to those skilled in the art that the same principles may be applied to other electronic devices.

Referring to the drawing, an electronic package 10, embodying the principles of the invention, includes an insulating wafer or base 16 which may be circular or may have any other suitable configuration. The wafer includes top and bottom surfaces 20 and 24 respectively, and is provided with a plurality of electrical leads 30 which are inserted in apertures 34 in the wafer. The apertures 34 and leads 30 are oriented near the periphery of the wafer. The leads 30 extend above the top surface 20 of the wafer 16 and below the bottom surface 24 of the wafer, with the portions 30A above the top surface being relatively short and adapted for connection to an electronic device. This portion of each lead includes a shoulder 44 which bears against the top surface of the insulating wafer and is of sufficient area to cover the aperture 34 in which it is positioned. The shoulders 44 thus prevent potting material from flowing out of the apertures 34 during manufacture of package 10. The portion 30B of each lead, which extends below the bottom surface of the wafer, is of considerable length and is intended, ultimately, for connection in an electrical circuit.

The leads 30 are made of a relatively thin, flexible material and thus are not rigid but may be easily deformed. Such leads are known as flying leads or pigtail leads. The lower portion 30B of each lead is of considerable length and may be of the order of two inches, whereas the shorter upper portion 30A of each lead may be perhaps one-quarter to one-half inch in length. In one suitable construction, the leads 30 are arrayed in a circle near the periphery of the insulating wafer 16.

According to the invention, a tubular insulating member 60 is provided in the space defined by the leads 30 below the bottom surface 24 of the insulating wafer 16. The tube 60 has a diameter substantially equal to the diameter of the inner circle defined by the leads 30 and thus, in effect, comprises a support for holding the leads in the desired relationship. The leads bear against the outer surface of the tube and are spaced apart parallel to each other. The tube 60 also includes a top wall 61 which bears against the lower surface 24 of wafer 16. A length of adhesive tape 64 or the like is secured at its inner end to the surface of the tube 60 and is wound about the lower portion 30B of the leads to form a rigid assembly of leads 30 and tube 60. The tape is of sufficient width to overlay a considerable portion of the length of the leads 30 to provide the desired strength and rigidity. However, the lower free ends 30C of the leads extend beyond the end of the tape so that they are accessible for test purposes or the like.

It is to be noted that, with the tube 60, wafer 16 and leads 30 all held in place, the wafer bears down on the top wall 61 of tube 60 and the leads 30 are drawn downwardly so that the shoulders 44 of the leads bear against top surface 20 of the wafer. The leads are thus held securely in place in the wafer. This permits the use of the most inexpensive combination of wafer and leads since the leads do not have to be molded or soldered in place in the wafer and the apertures 34 for receiving the leads 30 are not critical in size or shape.

The various parts described above may be assembled by hand, or, if desired, an assembly jig 70 may be used which includes a post 72 on which hollow tube 60 is threaded. The wafer 16, with its leads 30, is seated on the tube 60 with the leads extending along the outer surface of the tube and inserted in apertures 74 in the jig. With the parts thus positioned on the jig, the operation of applying the tape 64 may be performed with ease.

The device thus far described is rigid, the deformable leads are controlled and easy to handle, and the leads are accessible for performing test operations or the like.

A magnetic core transformer 68 which is to be mounted on the sub-assembly 10 includes a toroidal core 80 which is provided with a plurality of windings 84, the ends of which are soldered, welded, or otherwise secured to selected ones of the leads 30 above the top surface of the disk. At this stage in the preparation of the package, the core may be tested by inserting the free ends 30C of the leads in a socket in suitable test apparatus, not shown. If desired, selected ones of the leads may be clipped to provide a key for inserting the leads in a socket.

If the device is operative, a body 86 of insulating material may be molded about the transformer 68 and the upper portions of the leads to complete the packaging of the device. Other sealing arrangements, such as evacuated housings, might also be utilized.

The device thus prepared is ready for use or for shipment to a user. Since the leads 30 are held rigidly and securely in place, handling and shipment are easily and comfortably executed. Again, when the user receives the packaged device, he may test the device as described above. If the device is satisfactory and ready to use, the tape 64 and the insulating tube 60 may be removed and discarded and the device is ready for mounting in a suitable circuit. Of course, in such a mounting operation, the leads 30 may be cut to any desired length.

It is clear that the present invention provides an improved package for an electronic device which includes an insulating support and flexible leads.

What is claimed is:

1. A package for an electronic device for mounting on a circuit board comprising
- an insulating wafer having top and bottom surfaces,
- an electronic device secured to said top surface of said wafer,
- a plurality of flexible and normally deformable leads secured to said device and extending through said wafer and below the bottom surface thereof,
- a tube of insulating material removably positioned in the space between said leads beneath said insulating wafer and serving as a support for holding said leads in spaced-apart relationship,
- and securing means removably and temporarily attached to said leads and said insulating tube for maintaining them rigidly fixed together whereby said leads are effectively not deformable,
- a portion of each of said leads being accessible to test apparatus,
- said securing means and said tube being readily removable when it is desired to mount the package on a circuit board.

2. A package for an electronic comprising
- an insulating wafer for supporting an electron device, said wafer having top and bottom surfaces,
- an electronic device mounted on the top surface of said wafer,
- a plurality of elongated flexible and normally deformable leads secured to said electronic device and to said wafer, said leads extending through said wafer and below the bottom surface thereof,
- an insulating tube removably positioned in the space between said leads beneath said insulating wafer serving as a form for supporting said leads in spaced-apart relationship, said leads resting on the outer surface of said tube,
- and securing means removably and temporarily attached to said leads and said insulating tube for maintaining them rigidly fixed together whereby said leads are effectively not deformable,
- a portion of each of said leads being accessible to test apparatus,
- said securing means being readily removable to permit the removal of said tube when it is desired to mount the package on a circuit board.

3. A package for an electronic device comprising
- an insulating base having top and bottom surfaces,
- an electronic device mounted on the top surface of said base,
- a plurality of elongated flexible and normally deformable leads secured to said device and extending through said base and below the bottom surface thereof,
- a tube of insulating material positioned in the space between said leads and beneath said insulating base and serving as a form for supporting said leads in spaced-apart relationship,
- and an adhesive tape encircling said tube and said leads and holding said tube and said leads in the desired spatial relationship whereby said leads are effectively not deformable,
- a portion of each of said leads being accessible to test apparatus,
- said tape being readily removable to permit the removal of said tube whereby said leads may be inserted in and secured to a circuit board for carrying the package.

4. A package for an electronic device including
- an insulating wafer comprising a base for an electronic device, said wafer having top and bottom surfaces,
- an electronic device mounted on said top surface of said wafer,
- a plurality of elongated flexible leads secured to said wafer and connected to said electronic device thereon,
- a small portion of each lead lying on one side of said wafer, above the top surface thereof and the greater portion of each lead lying on the opposite side of said wafer below the bottom surface thereof,
- an insulating body positioned in the space between said greater portions of said leads with the leads lying on the surface of said body which thus serves as a form for supporting said leads in spaced-apart relationship,
- and an adhesive tape encircling said leads and said insulating body for maintaining them fixed in the desired spatial relationship whereby said leads are effectively not deformable,
- the ends of said greater portions of said leads being accessible to test apparatus.

5. A package for an electronic device including
- an insulating disk comprising a base for an electronic device, said disk having top and bottom surfaces,
- an electronic device mounted on the top surface of said disk,
- a plurality of elongated flexible leads secured to said base and connected to said electronic device and extending through said disk and below the bottom surface thereof, said leads being arranged in a circle,
- each lead including a shoulder which bears against said base,
- a small portion of each lead lying on one side of said disk and the greater portion of each lead lying on the opposite side of said disk,
- an insulating tube positioned in the space between said greater portions of said leads and serving as a form for supporting said leads in spaced-apart relationship, said leads being in contact with said insulating tube,
- and an adhesive tape secured at one end to said tube and enclosing said leads and said tube and maintaining said leads and said tube fixed in the desired spatial relationships,
- the ends of said greater portions of said leads being free and accessible to test apparatus.

References Cited by the Examiner

UNITED STATES PATENTS

| | | | |
|---|---|---|---|
| 2,766,435 | 10/56 | French | 317—101 |
| 2,881,405 | 4/59 | Yarbrough | 339—17 |
| 2,889,524 | 6/59 | Schmitz | 336—192 |

JOHN F. BURNS, *Primary Examiner.*

JOHN P. WILDMAN, LARAMIE E. ASKIN, DARRELL L. CLAY, *Examiners.*